United States Patent [19]

Goodman

[11] 4,433,469
[45] Feb. 28, 1984

[54] METHOD OF FORMING A SELF ALIGNED ALUMINUM POLYCRYSTALLINE SILICON LINE

[75] Inventor: Alvin M. Goodman, Princeton, N.J.
[73] Assignee: RCA Corporation, New York, N.Y.
[21] Appl. No.: 466,593
[22] Filed: Feb. 15, 1983

Related U.S. Application Data

[62] Division of Ser. No. 164,345, Jun. 30, 1980, Pat. No. 4,380,773.

[51] Int. Cl.$^3$ .......................................... H01L 21/285
[52] U.S. Cl. ..................................... 29/571; 148/174; 29/589
[58] Field of Search ................... 29/571, 589; 148/174

[56] References Cited

U.S. PATENT DOCUMENTS

| | | | |
|---|---|---|---|
| 3,177,100 | 4/1975 | Mayer et al. ........................ | 148/175 |
| 3,649,884 | 3/1972 | Haneta . | |
| 3,836,992 | 9/1974 | Abbas et al. .......................... | 357/23 |
| 4,054,895 | 10/1977 | Ham ................................... | 357/23 |
| 4,062,033 | 12/1977 | Suzuki ................................ | 357/52 |
| 4,062,034 | 12/1977 | Matsushita et al. ................. | 148/174 |
| 4,171,997 | 10/1923 | Irmler .................................. | 357/59 |
| 4,176,372 | 11/1979 | Matsushita et al. ................. | 357/52 |
| 4,249,968 | 2/1981 | Gardiner et al. .................... | 357/59 |
| 4,302,763 | 11/1981 | Ohuchi et al. ....................... | 357/59 |

OTHER PUBLICATIONS

Yamaguchi et al., "An Advanced MOS-IC Process Technoloy Using Local Oxidation of Oxygen-Doped Polysilicon Films", *IEEE J. of Solid State Circuits,* vol. SC-13, No. 4, Aug. 1978.
"Graded or Stepped Energy Band-Gap-Insulator MIS Structures (GI-MIS Structures (GI-MIS or SI-MIS)", D. J. DiMaria, Journal of Applied Physics, vol. 50, No. 9, Sep. 1979.

*Primary Examiner*—Aaron Weisstuch
*Assistant Examiner*—Hunter L. Auyang
*Attorney, Agent, or Firm*—Birgit E. Morris; Donald S. Cohen; Lawrence P. Benjamin

[57] ABSTRACT

An improved self-aligned conductive gate member formed by suppressing or decreasing the size of the as-deposited grains of polysilicon and by suppressing further grain growth which may occur during a subsequent annealing or processing step. By maintaining the as-deposited grains as small as possible, the initiation of intergranular voids is minimized. This is accomplished by forming a low resistivity oxygen doped polycrystalline silicon layer in place of the conventional polysilicon.

9 Claims, 1 Drawing Figure

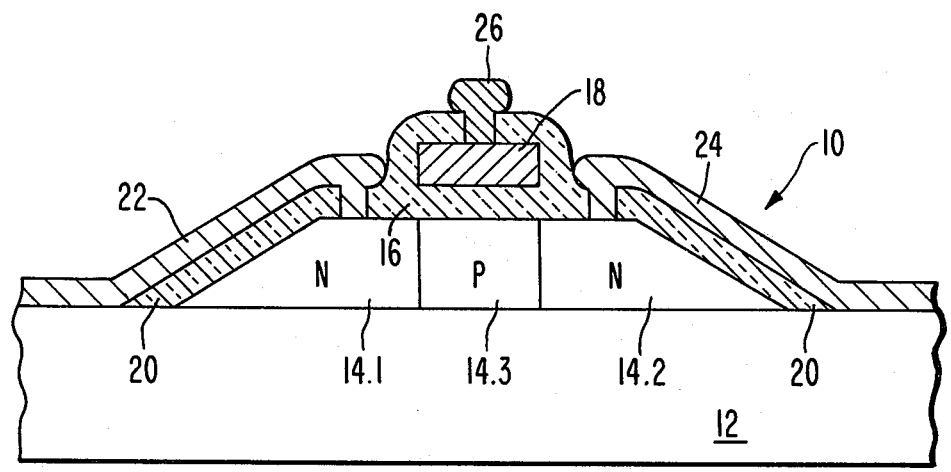

METHOD OF FORMING A SELF ALIGNED ALUMINUM POLYCRYSTALLINE SILICON LINE

This is a division of application Ser. No. 164,345, filed June30, 1980, now U.S. Pat. No. 4,380,773.

BACKGROUND OF THE INVENTION

This invention relates to semiconductor devices and, more particularly, to an improved self-aligned aluminum-to-gate member contact in the area of the underlying gate oxide.

It has been found, in certain instances, that one may advantageously increase the packing density of an integrated circuit if the contact is made directly to the gate member in the area directly over the thin gate oxide. However, it has long been realized that a high failure rate exists when an aluminum or other contact is made to a polycrystalline silicon (polysilicon) gate member in the area directly over the thin gate oxide. One theory which may explain this failure mechanism is that after depositing the poylsilicon gate member, any subsequent doping of the polysilicon with phosphorus using oxychloride ($POCL_3$), to produce a conductive polysilicon gate member, enhances grain growth in the polysilicon layer and thus initiates intergrain voids therein. Once the voids have been created, subsequent heat treatments or annealing steps which may occur, for example, during padoxide growth or during subsequent source and drain reoxidation steps, tend to extend the growth of the polysilicon grains and thus both increase the formation and the severity of the voids. As a result, when hydrofluoric (HF) acid is used in a subsequent processing step to remove any oxide that may either be undesired or in direct contact with the polysilicon layer, the underlying oxide is attacked by the HF through the voids created in the polysilicon layer. Thus, any subsequent gate metallization, in the area directly over the thin gate oxide, will result in a short circuit between the metallization and the substrate.

SUMMARY OF THE INVENTION

In accordance with the teachings of my invention, an improved, self-aligned conductive gate member is formed by suppressing or decreasing the size of as-deposited grains of polysilicon and by suppressing any further grain growth which may occur during any subsequent annealing or processing steps in order to prevent the initiation of intergrain voids. This is accomplished by forming a low resistivity oxygen doped polycrystalline silicon (SIPOS) layer in place of the conductive polysilicon.

An additional advantage resulting from producing finer grained polysilicon is higher resolution photolithographic capability. Further, since the finer grained polysilicon layer is void free it may be used as a mask for any subsequent ion implantation or plasma etching step that may be required.

BRIEF DESCRIPTION OF THE DRAWING

FIG. 1 is a cross-sectional view of my invention in which a SIPOS layer is utilized as a gate member.

DETAILED DESCRIPTION OF THE INVENTION

While the following exegesis will be described in terms of the structure and processing of an N-channel device, it should be obvious to those skilled in the art that this is only by way of example, since the conductivities of the various elements may be correspondingly changed without departing from the inventive concept. Similarly, while a device operated in the enhancement mode will be discussed, depletion type devices having similar characteristics may be substituted to achieve similar results. Further, while my novel device will be described using sapphire as an insulative substrate to describe a silicon-on-sapphire (SOS) device, it should be obvious that while sapphire is preferred, other similar materials such as spinel or monocrystalline beryllium oxide may be used with no apparent deleterious effects. In addition, while describing the structure and processing for a SOS device, it should also be obvious that the same principles espoused herein apply equally to bulk silicon devices.

Referring now to FIG. 1, there is shown a device 10 mounted on an insulative substrate 12 such as sapphire. An islnd, comprised of source region 14.1, drain region 14.2 and channel region 14.3 is shown as an N-channel device. Gate member 18, the subject of this invention, is shown as an aligned gate, that is, in alignemnt with the edges of channel region 14.3 and insulated from the island by means of the $SiO_2$ layer 16. Passivating layer 20 (which may also be $SiO_2$) covers the exposed portions of source region 14.1 and drain region 14.2 as well as gate member 18, except for the contact openings therein. Contact members 22 and 24 are shown in ohmic contact with source region 14.1 and drain region 14.2 respectively while contact member 26 is shown in ohmic contact with gate member 18.

In the practice of my invention, to form, for example, an SOS device 10, a polished sapphire substrate 12 is initially provided having a pair of broad, substantially parallel, flat surfaces with a layer of monocrystalline silicon formed on one surface thereof. The layer of silicon may, for example, be epitaxially deposited by the thermal decomposition of silane ($SiH_4$) in a hydrogen ($H_2$) ambient in much the same manner and proportions as described in U.S. Pat. No. 3,177,100. The silicon layer, in this instance, is grown to a thickness of about 0.5–0.6 microns. Thereafter, the silicon layer is formed into islands by providing the silicon surface with an appropriate layer or layers of masking material and thereafter removing the unwanted portions of masking layer (s) and silicon by etching, as is well-known in the art.

After the formation of the discrete islands, a layer of gate oxide 16 is grown over the islands to a thickness of about 300–2000 angstroms using dry oxygen at about 900° C. for a sufficient period of time of produce the required thickness. At this point in the traditional processing of a semiconductor device, one would deposit or form a layer of polycrystalline silicon (polysilicon) to form the gate member. However, my process deviates from the standard processing by forming a layer of oxygen doped polycrystalline silicon 18 (SIPOS) in place of the polysilicon. By way of example, SIPOS may be formed in a low pressure chemical vapor deposition (LPCVD) process by the pyrolytic decomposition of silane, flowing at a rate of about 60 cc/minute and nitrous oxide ($N_2O$) flowing at a rate of about 10.8 cc/minute for a period of about 45 minutes at 675° C. This will achieve a thickness of about 5600 angstroms.

While the above ratio of $N_2$ to $SiH_4$ is only one combination of these elements, which will produce the desired result, I have found that with the volumetric ratio ($\gamma$) of $N_2O$-to-$SiH_4$ from about 0.05 and higher, reduced grain size is obtained. It should be understood that, according to my present understanding, the minimum value of oxygen concentration necessary to keep the silicon grain size small would have to be greater than the solid solubility of oxygen in silicon. This varies as a function of temperature from about $2 \times 10^{-6}$ at about 900° C. to about $4 \times 10^{-5}$ at 1400°, it being recognized that the upper limit of oxygen concentration is imposed by difficulties in obtaining high conductivity and uniform growth. It has been found that the growth is not satisfactorily uniform when $\gamma$ exceeds about 0.4. Further, it has been found that it becomes more difficult to obtain high conductivity when $\gamma$ is high. Thus, by maintaining the $\gamma$ below about 0.20 a subsequent doping with, for example, phosphorus oxychloride will produce resistivity ($\rho$) in the region of about $2 \times 10^{-3}$ ohm cm. after being annelaed at a temperature up to about 1100° C.

Having thus formed the SIPOS layer, it may now be appropriately doped to make it conductive and then masked to define the gate region or line. Thereafter, the unwanted portions of the SIPOS layer are removed by etching. To complete the device and form, for example, a self-aligned gate structure, the SIPOS gate is now used as a mask and the silicon body or island either implanted or diffused with impurities to form source region 14.1 and drain region 14.2.

To complete the device, it is covered with an $SiO_2$ passivating layer 20 and contacts 22 and 24 formed in ohmic contact with the active regions, which form the source and drain regions 14.1 and 14.2 respectively. Similarly, contact 26 is formed in ohmic contact with gate member 18 after which, if necessary, the device is covered with a second passivating layer (not shown).

While I have described the manufacture of the device and the device in terms of doping the SIPOS layer after it has been formed, it should now be obvious to those skilled in the art that the doping of the SIPOS may be done in situ, when the SIPOS layer is being formed. If desired, conductivity modifiers may be injected into the SIPOS by means of ion implantation.

Further, I have found that my invention has particular applicability to prevent similar defects which may, for example, occur in double polysilicon applications. For example, in structures where contact holes are opened in a layer of $SiO_2$ to expose an upper polysilicon layer which overlies and is insulated from a lower polysilicon layer, a polysilicon-to-polysilicon short can occur due to defects which may have been created as a result of the presence of voids in the upper polysilicon layer. As before, when hydrofluoric acid is used to open the contact hole, defects, in the nature of voids in the upper polysilicon layer, can be penetrated by the hydrofluoric acid and attack the interlevel oxide. Consequently, any subsequent metallization will short the two levels of polysilicon. By forming the upper polysilicon layer as previously described, the possibility of short circuits is minimized.

Thus, I have described a semiconductor device having a self-aligned gate with the usual source and drain members separated by a channel region and a gate member for modulating the current flow in the channel region which gate member is insulated from the semiconductor body by a layer of gate oxide. However, the distinguishing feature of my invention is the use of a conductive layer of SIPOS, as a gate member or interconnect line having smaller grain size than he traditional polysilicon gate member or interconnect line. The smaller grain size, having minimized the formation of intergrain voids, also allows for finer grain lithography.

What I claim is:

1. In a process for forming a semiconductor device having a pair of active regions of a first conductivity type formed within a body of semiconductor material of a second conductivity type at the surface of the body, the body of semiconductor material having a channel region of the second conductivity type formed therein at the surface thereof and separating the active regions, the device having a gate member aligned with the channel region and separated from the semiconductor body by a layer of insulating material and contact means in ohmic contact with each of the active regions and the gate member respectively, an improved process for forming the gate member comprising the steps of:
    heating the body to a temperature ranging between about 650° C. and 700° C.; and
    flowing $SiH_4$ and $N_2O$ across the semiconductor body while maintaining a given ratio of $N_2O$ to $SiH_4$.

2. The process of claim 1, comprising the step of:
    maintaining the volumetric ratio of $N_2O$-to-$SiH_4$ in the range from about 0.05 to about 0.20.

3. The process of claim 2, comprising the step of:
    forming the body of semiconductor material as an island of silicon on an insulative substrate.

4. The process of claim 3, comprising the step of:
    selecting the insulative substrate from the group consisting of sapphire, spinel and monocrystalline beryllium oxide.

5. The process of claim 2, comprising the step of:
    conductively doping the gate member in situ as the gate member is being formed.

6. The process of claim 2, comprising the step of:
    conductively doping the gate member after it is formed.

7. The process of claim 1 comprising the further step of:
    forming the body of semiconductor material as an island of silicon on an insulative substrate.

8. The process of claim 7, wherein:
    the insulative substrate is selected from the group consisting of sapphire, spinel and monocrystalline beryllium oxide.

9. The process of claim 8, wherein:
    the body of semiconductor material is bulk silicon.

* * * * *